(12) United States Patent
Sanjeevarao et al.

(10) Patent No.: US 8,913,436 B2
(45) Date of Patent: Dec. 16, 2014

(54) NON-VOLATILE MEMORY (NVM) WITH WORD LINE DRIVER/DECODER USING A CHARGE PUMP VOLTAGE

(71) Applicants: Padmaraj Sanjeevarao, Austin, TX (US); David W. Chrudimsky, Austin, TX (US)

(72) Inventors: Padmaraj Sanjeevarao, Austin, TX (US); David W. Chrudimsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/826,958

(22) Filed: Mar. 14, 2013

(65) Prior Publication Data

US 2014/0269140 A1 Sep. 18, 2014

(51) Int. Cl.
*G11C 16/06* (2006.01)
*G11C 8/00* (2006.01)
*G11C 5/14* (2006.01)
*G11C 8/08* (2006.01)

(52) U.S. Cl.
CPC . *G11C 5/146* (2013.01); *G11C 8/08* (2013.01)
USPC .................. 365/185.23; 365/230.06

(58) Field of Classification Search
CPC ........................................ G11C 16/08

USPC ....................................................... 365/185.23
See application file for complete search history.

(56) References Cited

U.S. PATENT DOCUMENTS

| | | | | |
|---|---|---|---|---|
| 4,782,247 | A | * | 11/1988 | Yoshida .......................... 326/81 |
| 4,820,941 | A | * | 4/1989 | Dolby et al. ............. 365/185.23 |
| 5,018,107 | A | * | 5/1991 | Yoshida .................... 365/185.23 |
| 5,039,882 | A | * | 8/1991 | Arakawa ....................... 326/106 |
| 5,136,541 | A | * | 8/1992 | Arakawa .................... 365/185.23 |
| 5,490,119 | A | * | 2/1996 | Sakurai et al. ........... 365/230.08 |
| 5,726,938 | A | * | 3/1998 | Okamoto ................. 365/189.11 |
| 5,949,735 | A | * | 9/1999 | Jeong ....................... 365/230.06 |
| 6,385,099 | B1 | | 5/2002 | Taub |
| 6,963,226 | B2 | | 11/2005 | Chiang |
| 7,317,335 | B2 | | 1/2008 | Min et al. |
| 7,446,566 | B1 | | 11/2008 | Chrudimsky |

* cited by examiner

*Primary Examiner* — Son Mai
(74) *Attorney, Agent, or Firm* — James L. Clingan, Jr.; David G. Dolezal

(57) ABSTRACT

A word line driver that includes a pull up transistor for biasing a node of a stack of transistors that are located between a high supply voltage terminal and a low supply voltage terminal. The node is biased at a voltage that is between the high supply voltage and the low supply voltage. The stack of transistors includes a stack of decode transistors and a cascode transistor. The cascode transistor is located between the node and a second node of the stack that is coupled to an inverting circuit.

20 Claims, 3 Drawing Sheets

NON-VOLATILE MEMORY (NVM) WITH WORD LINE DRIVER/DECODER USING A CHARGE PUMP VOLTAGE

BACKGROUND

1. Field

This disclosure relates generally to non-volatile memories (NVM), and more specifically, to NVMs that use a charge pump voltage in a word line driver/decoder.

2. Related Art

Non-volatile memory (NVM) such as electrically-erasable programmable read-only memory (EEPROM) and flash uses voltage levels that exceed the input power supply voltage for use during read, write, erase, and write verify operations. In the case where these elevated voltages are internally supplied, which is the typical case, they are most commonly generated by a charge pump. The more current that must be supplied, the larger the charge pump must be and thus require more area. Any area increase ultimately leads to a cost increase that may be due to actually increase in the cost of the die as well as increased packaging size that increases the cost of the package which in turn may increase cost in using the packaged die. Accordingly it is desirable to have circuits that draw as little current as possible from the charge pump. Although for other reasons, such as battery drain, it is common to design for low current, the particular effect of circuits that use the charge pump voltage is particularly important in minimizing current drain.

Accordingly there is a need to improve upon reducing current drain on charge pumps in NVMs which are particularly dependent on charge pumps.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect a word line driver/decoder of a non-volatile memory (NVM) has a series decoder of N channel transistors between a select node and ground in which the select node is brought to a logic low by the N channel transistors all being conductive. Between a charge pump voltage and the select node is a conductive load that is prevented from being a leakage path from the charge pump voltage through the N channel transistors by applying a reference voltage, which may be an external power supply voltage, to the select node. This is better understood by reference to the drawings and the following description.

VB1 is a voltage that limits the amount of current that P channel 32 may conduct to ensure that transistors 38-42 can pull nodes 35 and 39 to a logic low. VB2 is a voltage that makes sure that devices below transistor 34 receive a voltage no greater than a safe voltage for low voltage transistors which means VB2 equals VDD plus a threshold voltage of transistor 34.

Figure 1:
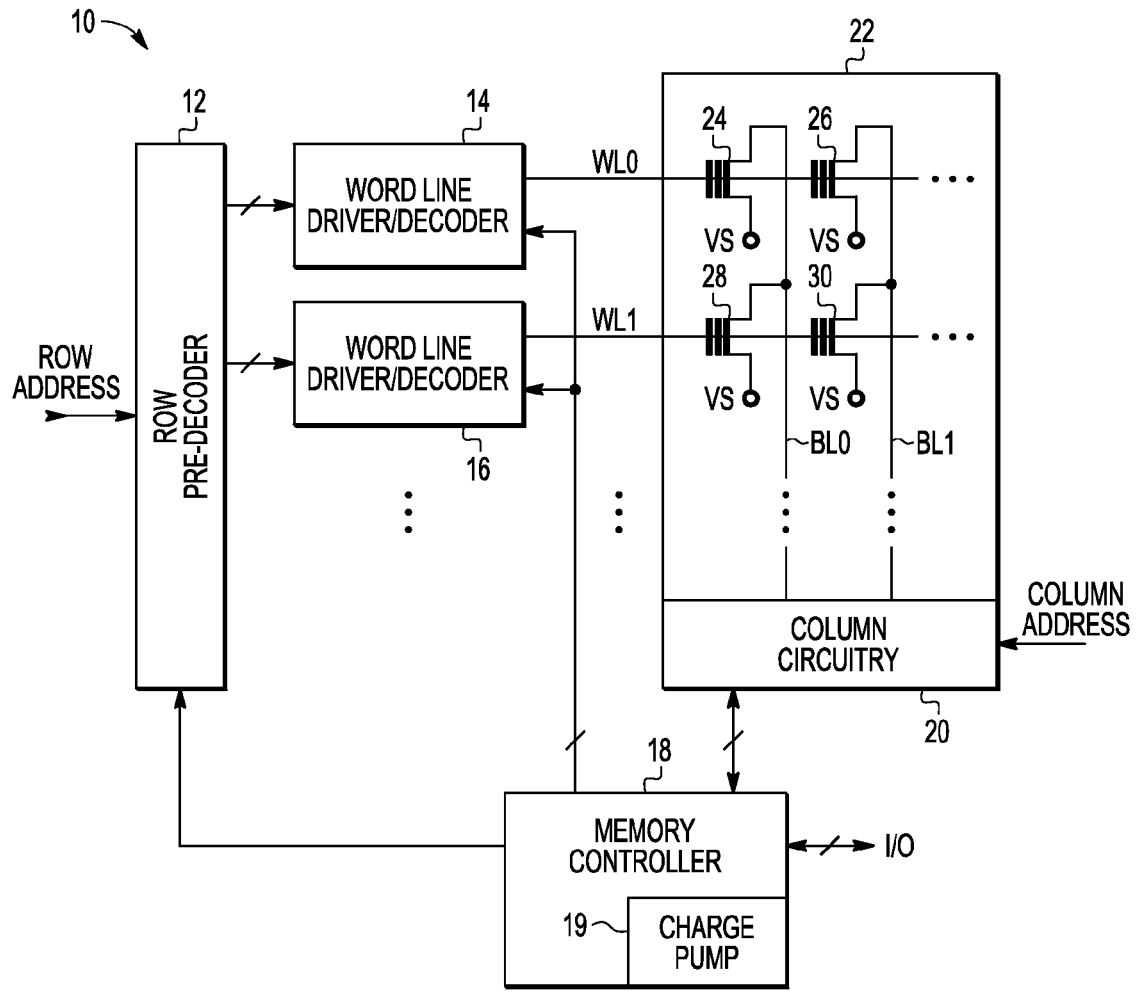
FIG. 1 is a block diagram of an embodiment of a non-volatile memory (NVM) in accordance with the present disclosure.

Shown in FIG. 1 is a block diagram of a non-volatile memory (NVM) comprising a row pre-decoder 12 that receives a row address, a word line driver/decoder 14 coupled to the row pre-decoder and a word line WL0, a word line driver/decoder 16 coupled to row predecoder 12 and a word line WL1, a memory controller 18 coupled to row predecoder 12 and word line driver/decoders 14 and 16 that has an input/output shown as I/O, a charge pump 19 that is within memory controller 18, column circuitry 20 coupled to memory controller 18 and that receives a column address, and an array 22 coupled to column circuitry 20 and word line driver/decoders 14 and 16 through word lines WL0 and WL1, respectively.

In operation as directed by memory controller 18, row decoder 12 receives a row address and provides predecoded signals to the word line driver/decoders such as word line driver/decoders 14 and 16. The word line driver/decoder that is selected enables the word line to which it is coupled. The voltage applied to the selected word line is dependent upon the operation being performed, typically a read, program, or erase and may be further controlled within the performance of a program or erase operation. Voltages that are different from the voltage at the positive power supply terminal, VDD, are achieved by a charge pump 19, which may include multiple pumps, within memory controller 18. Column circuitry 20 provides biasing of the bit lines and the VS terminals, provides program data for programming, and performs sensing for reads. In a typical arrangement, array 22 would be one block of many blocks that make up a larger NVM storage than shown in FIG. 1. For example, for a memory having 8 megabytes, there may be 64 blocks such as array 22 in which only two would be active at any given time. In addition to memory controller 18, including charge pump 19, the particular elements shown in FIG. 1 may be such that they are also used in one or more of the other blocks not shown in FIG. 1. For example portions of row predecoder 12 may be used by other blocks.

Figure 2:
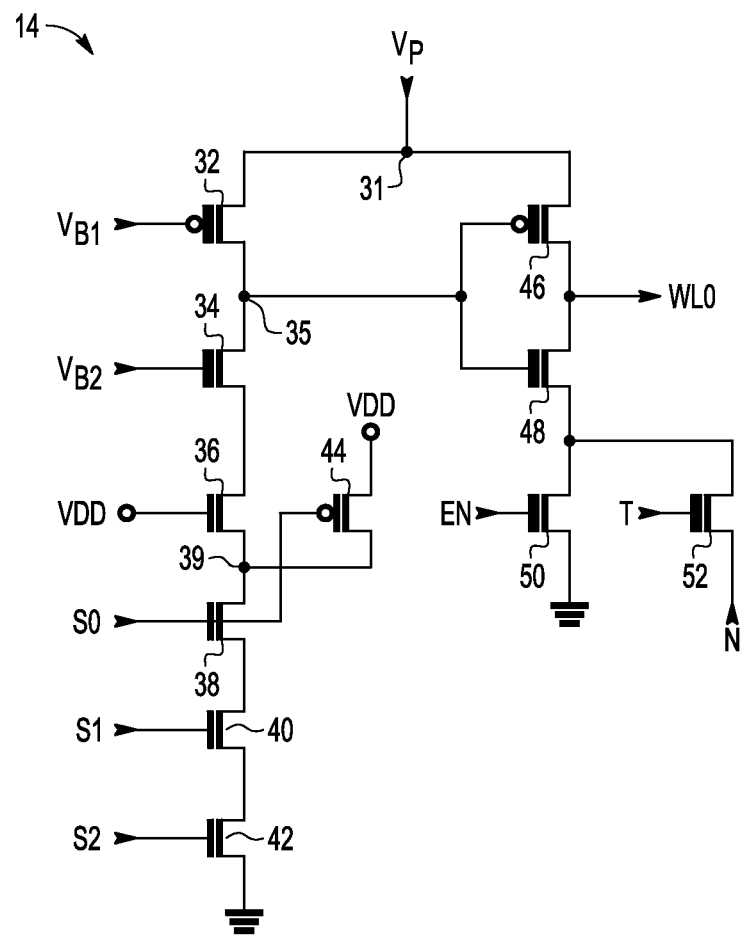
FIG. 2 is a circuit diagram of a word line driver/decoder of the NVM of FIG. 1.

FIG. 2 is a circuit diagram of word line driver/decoder 14 comprising a P channel transistor 32, an N channel transistor 34, an N channel transistor 36, an N channel transistor 38, an N channel transistor 40, an N channel transistor 42, a P channel transistor 44, a P channel transistor 46, an N channel transistor 48, an N channel transistor 50, and an N channel transistor 52. Transistors 32, 34, 46, 48, 50, and 52 are high voltage transistors. Transistors 36, 38, 40, 42, and 44 are low voltage transistors. High voltage transistors are able to withstand higher voltages than low voltage transistors, but they are not as fast and they require more space than low voltage transistors. In construction the high voltage transistors are made with a thicker gate dielectric so for a given current drive, they require significantly more channel width and thus more space. Voltage Vp is a voltage provided by charge pump 19 and is received at a node 31. VDD is a terminal that carries a power supply voltage that is supplied by the external power supply that is external to the integrated circuit that includes memory 10. The ground shown in FIG. 2 is the other terminal of the external power supply that is negative relative to the voltage at VDD. Terminal N as shown in FIG. 2 is for providing a negative voltage relative to ground, which is used based on various modes of operation including test and normal modes.

Transistor 32 has a source connected to node 31, a gate that receives a bias voltage VB1, and a drain connected to a node 35. Transistor 34 has a drain connected to node 35, a gate that receives a bias voltage VB2, and a source. Transistor 36 has a drain connected to the source of transistor 34, a gate connected to VDD, and a source connected to a node 39. Transistor 38 has a drain connected to node 39, a gate that receives a predecoded signal S0, and a source. Transistor 40 has a drain connected to the source of 38, a gate that receives a predecoded signal S1, and a source. Transistor 42 has a drain connected to the source of transistor 40, a gate that receives a predecoded signal S2, and a source connected to ground. Transistor 46 has a source connected to node 31, a gate connected to node 35, and a drain connected to word line WL0. Transistor 48 has a drain connected to word line WL0, a gate connected to node 35, and a source. Transistor 50 has a drain connected to the source of transistor 48, a gate that receives an enable signal EN, and a source connected to ground. Transistor 52 has a drain connected to the drain of transistor 50, a gate that receives a test signal T, and a source connected to terminal N.

In operation, predecoded signals S0, S1, and S2 are provided to transistors 38, 40, and 42, respectively, from row predecoder 12. When all of predecoded signals S0, S1, and S2 are a logic high, word line driver/decoder 14 is selected. When any of signals S0, S1, and S2 are a logic low, word line driver/decoder 14 is deselected. In a typical arrangement, there are many subarrays and all of signals S0, S1, and S2 will be a logic low when array 22 is deselected. Thus when array 22 is not selected, signal S0 will be a logic low which will cause transistor 44 to be conductive. With transistor 44 conductive, node 39 will be at the voltage at VDD, the power supply voltage. The power supply voltage is particularly convenient, but another reference could be generated and used to bias node 39 when array 22 is deselected. For the example of there being 64 subarrays, which may also be called blocks, nearly all would be deselected. The number deselected could easily all but one or two, depending upon the particular memory architecture chosen. In the case of array 22 being deselected, node 39 is clamped to the voltage at VDD to ensure that transistor 36 is non-conductive. With transistor 36 non-conductive, there is no leakage path from Vp to ground through the current path of transistors 32, 34, 36, 38, 40, and 42. Transistors 36, 38, 40, 42 are low voltage transistors for speed and area, but by being low voltage transistors, leak significantly more current than high voltage transistors. Thus there is significant reduction in leakage from voltage Vp by blocking the path through transistors 34, 36, 38, 40, and 42. Although there is still leakage through transistors 38, 40, and 42, this current is drawn from the voltage at VDD rather than from charge pump 19 that supplies voltage Vp.

For the case when array 22 is a block that is selected, when node 39 is pulled to a logic low by predecoded signals S0, S1, and S2 being a logic high, this is coupled through transistor 36 and transistor 34 to the gates of transistors 46 and 48. When array 22 is a selected block, enable signal EN, derived from block select signals, is a logic high which causes transistor 50 to be conductive. With transistor 50 coupling the source of transistor 48 to ground, transistor 46 becomes conductive, and transistor 48 becomes non-conductive which causes word line WL0 to switch to a logic high at the level of voltage Vp. This causes the memory cells along word line WL0 to be able to be read, programmed, or erased based on the operation being performed. The voltage of the logic high is dependent on the level of voltage Vp which is dependent upon the operation in question, such as read, program, or erase. Also the level of voltage Vp can be different during an operation or even from one program operation to another such as from a regular program operation to a soft program operation.

VB1 is a voltage that limits the amount of current that P channel 32 may conduct to ensure that transistors 38, 40, and 42 can pull nodes 35 and 39 to a logic low. VB2 is a voltage that makes sure that transistors 36, 38, 40, and 42 receive a voltage no greater than a safe voltage for low voltage transistors. An effective voltage for voltage VB2 then is the voltage at VDD plus the threshold voltage of transistor 34.

For the case of array 22 being a selected block but word line WL0 being deselected and brought into effect with a logic low applied to word line WL0. Node 39 is at a logic high responsive to any one of transistors 38, 40, and 42 being non-conductive which occurs when at least one of predecoded signals S0, S1, or S2 is a logic low. As stated previously, for the case of array 22 being a deselected block, then all three of predecoded signals S0, S1, and S2 are a logic low for the duration of the deselection so that transistor 44 is ensured of being conductive as are all of the word line driver/decoders that drive the word lines of array 22. On the other hand, for this case of array 22 being a selected block, then only when signal S0 is a logic low is transistor 44 conductive and thus preventing leakage from charge pump 19. Thus, when word line WL0 is deselected due only to one or both of predecoded signals S1 and S2 being a logic low with predecoded signal S0 being a logic high, there is a leakage path from voltage Vp supplied by charge pump 19 through transistors 38, 40, and 42 due to transistor 44 being non-conductive. A logic gate could be added to ensure that transistor 44 was active anytime word line WL0 was deselected, but in light of the fact that the percentage of the blocks that are deselected at any given time is so high, the additional benefit in doing so is relatively small. With at least one of predecoded signals S0, S1, and S2 being a logic low, node 39 is a logic high. The logic high at node 39 is coupled to node 35 through transistors 34 and 36 which are conductive. The logic high on node 35 makes transistor 36 non-conductive and enables node 35 to then be pulled to voltage Vp by transistor 32. Voltage Vp at node 35 causes transistor 46 to be non-conductive and transistor 48 to be conductive. With transistor 50 being conductive, word line WL0 is at a logic low, the deselected condition for word line WL0.

Thus, it is seen that a word line driver/decoder can use the benefits of low voltage transistors where they are most needed while avoiding having that leakage drawn from the elevated voltages that are beneficial for NVMs. The leakage still occurs, but the vast majority of that leakage is drawn from the external power supply instead of the elevated voltages which are typically generated on chip by charge pumps.

Figure 3:
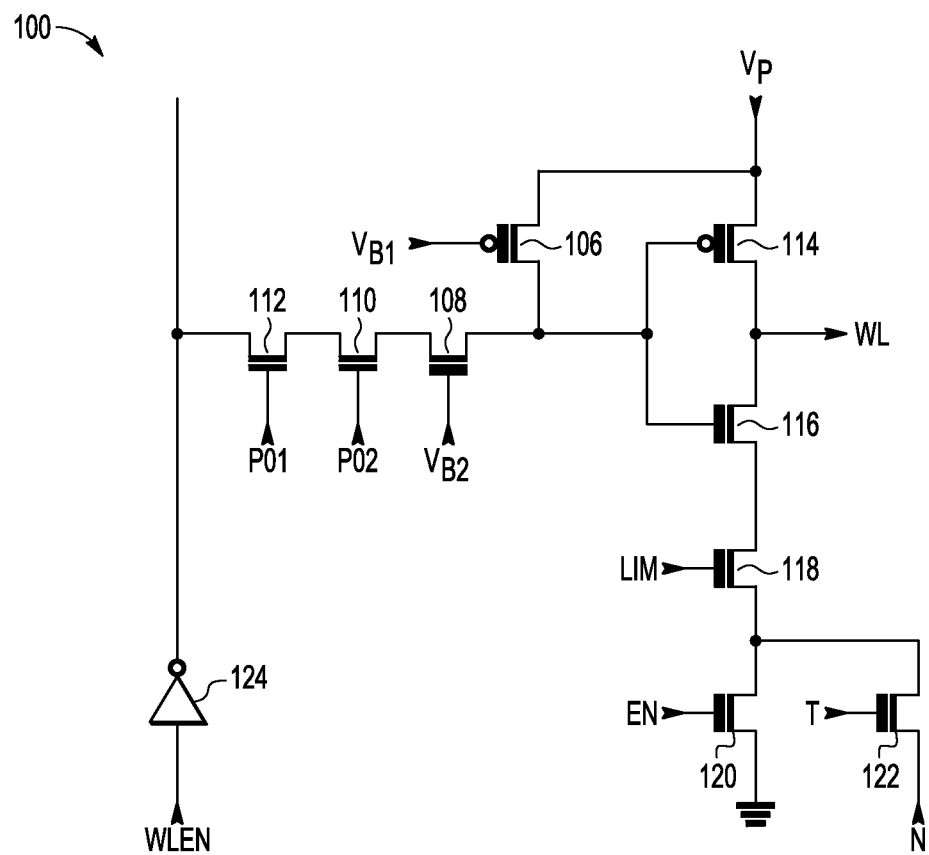
FIG. 3 is a circuit diagram of a word line driver/decoder of the prior art.

Shown in FIG. 3 is a prior art word line driver/decoder 100 that does not have the leakage control of the word line driver/decoders of memory 10. Word line driver/decoder 100 comprises high voltage P channel transistors 106 and 114, N channel high voltage transistors 108, 116, 118, 120, and 122, low voltage transistors 110 and 112, and an inverter 124 comprised of low voltage transistors connected as shown. The functional operation is substantially the same as for word line driver/decoder 14 shown in FIG. 2 in which, if the block is selected, word line WL is provided at a logic high if both predecoded inputs P01 and P02 are a logic high. Word line driver/decoder 100 receives only two predecoded signals from the row decoder. Transistor 118, with a limit input LIM, limits current drawn from voltage VP provided by a charge pump.

By now it should be appreciated that in some embodiments, there has been provided a word line driver. The word line driver includes a first stack of transistors. The first stack includes a plurality of decode transistors coupled in a stack between a first node of the first stack of transistors and a first voltage supply terminal for supplying a first supply voltage, wherein each of the decode transistors includes a control electrode to receive a decode signal of a plurality of decode signals. The first stack further includes a cascode transistor having a first current electrode connected to the first node, the cascode transistor including a control electrode coupled to a source voltage terminal for providing a source voltage. The first stack further includes a third transistor, a first current electrode of the third transistor is connected to a second node of the first stack of transistors, wherein the second current electrode of the third transistor is coupled to a second supply voltage terminal for supplying a second supply voltage, the second node is coupled to a second current electrode of the cascode transistor. The word line driver further includes a pull up transistor having a first current electrode coupled to the first node, a second current electrode coupled to a third supply voltage terminal for supplying a third supply voltage, and a control electrode coupled to a decode signal of the plurality of decode signals, wherein the second supply voltage is higher than the first supply voltage and higher than the third supply voltage, wherein the third supply voltage is higher than the first supply voltage. The word line driver further includes an inverting circuit including an input and an output, the input is coupled to the second node, wherein inverting circuit provides at its output, and inverted logic state of the second node. The word line driver has further characterizations by which the plurality of decode transistors are characterized as lower voltage transistors and the third transistor is characterized as a higher voltage transistor. The word line driver may have a further characterization by which wherein the source voltage terminal is connected to the third supply voltage terminal and supplies the third supply voltage. The word line driver may have a further characterization by which the output of the inverting circuit is coupled to a word line. The word line driver may have a further characterization by which the decode transistors and the cascode transistor are characterized as N-channel transistors and the pull up transistor and the third transistor are characterized as P-channel transistors. The word line driver may have a further characterization by which during operation, the first node operates at a voltage in a first range between a voltage of the first voltage supply terminal and a voltage of the third voltage supply terminal and the second node operates at a voltage in a second range between a voltage of the first voltage supply terminal and a voltage of the second voltage supply terminal. The word line driver may have a further characterization by which the control electrode of the pull up transistor is connected to a control electrode of a top transistor in the stack of the plurality of decode transistors. The word line driver may have a further characterization by which the inverting circuit includes an N-channel transistor and a P-channel transistor each including a control electrode connected to the input of the inverting circuit, wherein a first current electrode of the N-channel transistor is connected to a first current electrode of the P-channel transistor, wherein the N-channel transistor and the P-channel transistor are characterized as higher voltage transistors. The word line driver may have a further characterization by which during operation, the output of the inverting circuit operates at a voltage in a third range at least between a voltage of the first voltage supply terminal and a voltage of the second voltage supply terminal. The word line driver may have a further characterization by which the first stack of transistors further includes a fourth transistor located in the first stack between the second node and the cascode transistor wherein the fourth transistor is characterized as a higher voltage transistor. The word line driver may have a further characterization by which the cascode transistor is characterized as a lower voltage transistor. The word line driver may have a further characterization by which the cascode transistor and the fourth transistor are N-channel transistors. The word line driver may have a further characterization by which the cascode transistor is characterized as a lower voltage transistor. The word line driver may have a further characterization by which the cascode transistor is characterized as a higher voltage transistor. The word line driver may have a further characterization by which during operation, the pull up transistor biases the first node at the voltage of the third supply voltage terminal when the plurality of decode signals are at non asserted levels. The word line driver may have a further characterization by which the first node is at a voltage of the third supply voltage terminal and the second node is at a voltage of the second supply voltage terminal when the plurality of decode signals are at non asserted levels. The word line driver may have a further characterization by which the third transistor includes a control electrode that is connected to a second source voltage terminal for providing a second source voltage, wherein the second source voltage is less than the second supply voltage so as to limit an amount of current flowing through the transistor when conductive. The word line driver may have a further characterization by which the pull up transistor is characterized as a lower voltage transistor. The word line driver may have a further characterization by which a memory comprises the word line driver and the memory further includes an address decoder, the address decoder providing the decode signals; an array of memory cells; and a plurality of word lines, wherein the word line driver is coupled to provide a word line signal on a word line of the plurality of word lines, wherein the word line is coupled to a subset of memory cells of the array. The word line driver may have a further characterization by which a charge pump including an output coupled to the second supply voltage terminal.

Also disclosed is a word line that includes a first stack of transistors. The first stack includes a plurality of decode transistors coupled in a stack between a first node of the first stack of transistors and a first voltage supply terminal for supplying a first supply voltage, wherein each of the decode transistors includes a control electrode to receive a decode signal of a plurality of decode signals. The first stack further includes a first cascode transistor having a first current electrode connected to the first node, the first cascode transistor including a control electrode coupled to a source voltage terminal for providing a source voltage. The first stack further includes a second cascode transistor having a first current electrode coupled to a second current electrode of the first cascode transistor. The first stack further includes a third transistor, a first current electrode of the third transistor is connected to a second node of the first stack of transistors, wherein the second current electrode of the third transistor is coupled to a second supply voltage terminal for supplying a second supply voltage, the second node is coupled to a second current electrode of the second cascode transistor. The word line driver further includes a pull up transistor having a first current electrode connected to the first node, a second current electrode coupled to a third supply voltage terminal for supplying a third supply voltage, and a control electrode connected to a decode signal of the plurality of decode signals, wherein the second supply voltage is higher than the first supply voltage and higher than the third supply voltage, wherein the third supply voltage is higher than the first supply voltage. The word line driver further includes an inverting circuit including an input and an output, the input is coupled to the second node, wherein inverting circuit provides at its output, and inverted logic state of the second node. The word line driver has further characterizations by which the plurality of decode transistors, the first cascode transistor, and the pull up transistor are characterized as lower voltage transistors, the third transistor and the second cascode transistor are characterized as higher voltage transistors, and the plurality of decode transistors, the first cascode transistor, and the second cascode transistor are N-channel transistors, and the pull up transistor and the third transistor are P-channel transistors.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. For example, it may be feasible to use an N channel transistor in place of P channel transistor 44 although there are advantages to using a P channel transistor. For example, predecoded signal S0 can be retained as is and not require a complement. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A word line driver comprising:
a first stack of transistors, the first stack including:
a plurality of decode transistors coupled in a stack between a first node of the first stack of transistors and a first voltage supply terminal for supplying a first supply voltage, wherein each of the decode transistors includes a control electrode to receive a decode signal of a plurality of decode signals;
a cascode transistor having a first current electrode connected to the first node, the cascode transistor including a control electrode coupled to a source voltage terminal for providing a source voltage;
a third transistor, a first current electrode of the third transistor is connected to a second node of the first stack of transistors, wherein the second current electrode of the third transistor is coupled to a second supply voltage terminal for supplying a second supply voltage, the second node is coupled to a second current electrode of the cascode transistor;
a pull up transistor having a first current electrode coupled to the first node, a second current electrode coupled to a third supply voltage terminal for supplying a third supply voltage, and a control electrode coupled to a decode signal of the plurality of decode signals, wherein the second supply voltage is higher than the first supply voltage and higher than the third supply voltage, wherein the third supply voltage is higher than the first supply voltage; and
an inverting circuit including an input and an output, the input is coupled to the second node, wherein inverting circuit provides at its output, and inverted logic state of the second node;
wherein the plurality of decode transistors are characterized as lower voltage transistors; and
wherein the third transistor is characterized as a higher voltage transistor.

2. The word line driver of claim 1 wherein the source voltage terminal is connected to the third supply voltage terminal and supplies the third supply voltage.

3. The word line driver of claim 1 wherein the output of the inverting circuit is coupled to a word line.

4. The word line driver of claim 1 wherein the decode transistors and the cascode transistor are characterized as N-channel transistors and the pull up transistor and the third transistor are characterized as P-channel transistors.

5. The word line driver of claim 1 wherein:
during operation, the first node operates at a voltage in a first range between a voltage of the first voltage supply terminal and a voltage of the third voltage supply terminal; and
during operation, the second node operates at a voltage in a second range between a voltage of the first voltage supply terminal and a voltage of the second voltage supply terminal.

6. The word line driver of claim 1 wherein the control electrode of the pull up transistor is connected to a control electrode of a top transistor in the stack of the plurality of decode transistors.

7. The word line driver of claim 1 wherein the inverting circuit includes an N-channel transistor and a P-channel transistor each including a control electrode connected to the input of the inverting circuit, wherein a first current electrode of the N-channel transistor is connected to a first current electrode of the P-channel transistor, wherein the N-channel transistor and the P-channel transistor are characterized as higher voltage transistors.

8. The word line driver of claim 1 wherein during operation, the output of the inverting circuit operates at a voltage in a third range at least between a voltage of the first voltage supply terminal and a voltage of the second voltage supply terminal.

9. The word line driver of claim 1 wherein the first stack of transistors further includes a fourth transistor located in the first stack between the second node and the cascode transistor wherein the fourth transistor is characterized as a higher voltage transistor.

10. The word line driver of claim 9 wherein the cascode transistor is characterized as a lower voltage transistor.

11. The word line driver of claim 9 wherein the cascode transistor and the fourth transistor are N-channel transistors.

12. The word line driver of claim 1 wherein the cascode transistor is characterized as a lower voltage transistor.

13. The word line driver of claim 1 wherein the cascode transistor is characterized as a higher voltage transistor.

14. The word line driver of claim 1 wherein during operation, the pull up transistor biases the first node at the voltage of the third supply voltage terminal when the plurality of decode signals are at non asserted levels.

15. The word line driver of claim 1 wherein the first node is at a voltage of the third supply voltage terminal and the second node is at a voltage of the second supply voltage terminal when the plurality of decode signals are at non asserted levels.

16. The word line driver of claim 1 wherein the third transistor includes a control electrode that is connected to a second source voltage terminal for providing a second source voltage, wherein the second source voltage is less than the second supply voltage so as to limit an amount of current flowing through the transistor when conductive.

17. The word line driver of claim 1 wherein the pull up transistor is characterized as a lower voltage transistor.

18. A memory comprising the word line driver of claim 1, the memory further comprising:
   an address decoder, the address decoder providing the decode signals;
   an array of memory cells; and
   a plurality of word lines, wherein the word line driver is coupled to provide a word line signal on a word line of the plurality of word lines, wherein the word line is coupled to a subset of memory cells of the array.

19. The memory of claim 18 further comprising:
   a charge pump including an output coupled to the second supply voltage terminal.

20. A word line driver comprising:
   a first stack of transistors, the first stack including:
      a plurality of decode transistors coupled in a stack between a first node of the first stack of transistors and a first voltage supply terminal for supplying a first supply voltage, wherein each of the decode transistors includes a control electrode to receive a decode signal of a plurality of decode signals;
      a first cascode transistor having a first current electrode connected to the first node, the first cascode transistor including a control electrode coupled to a source voltage terminal for providing a source voltage;
      a second cascode transistor having a first current electrode coupled to a second current electrode of the first cascode transistor; and
      a third transistor, a first current electrode of the third transistor is connected to a second node of the first stack of transistors, wherein the second current electrode of the third transistor is coupled to a second supply voltage terminal for supplying a second supply voltage, the second node is coupled to a second current electrode of the second cascode transistor;
   a pull up transistor having a first current electrode connected to the first node, a second current electrode coupled to a third supply voltage terminal for supplying a third supply voltage, and a control electrode connected to a decode signal of the plurality of decode signals, wherein the second supply voltage is higher than the first supply voltage and higher than the third supply voltage, wherein the third supply voltage is higher than the first supply voltage; and
   an inverting circuit including an input and an output, the input is coupled to the second node, wherein inverting circuit provides at its output, and inverted logic state of the second node;
   wherein the plurality of decode transistors, the first cascode transistor, and the pull up transistor are characterized as lower voltage transistors;
   wherein the third transistor and the second cascode transistor are characterized as higher voltage transistors; and
   wherein the plurality of decode transistors, the first cascode transistor, and the second cascode transistor are N-channel transistors, and the pull up transistor and the third transistor are P-channel transistors.

* * * * *